(12) United States Patent
Takahashi et al.

(10) Patent No.: US 7,988,835 B2
(45) Date of Patent: Aug. 2, 2011

(54) SILICON DOT FORMING METHOD AND SILICON DOT FORMING APPARATUS

(75) Inventors: Eiji Takahashi, Kyoto (JP); Takashi Mikami, Kyoto (JP); Shigeaki Kishida, Kyoto (JP); Kenji Kato, Kyoto (JP); Atsushi Tomyo, Osaka (JP); Tsukasa Hayashi, Kyoto (JP); Kiyoshi Ogata, Kyoto (JP); Yuichi Setsuhara, Osaka (JP)

(73) Assignees: Nissin Electric Co., Ltd., Kyoto (JP); EMD Corporation, Kyoto (JP)

( * ) Notice: Subject to any disclaimer, the term of this patent is extended or adjusted under 35 U.S.C. 154(b) by 1221 days.

(21) Appl. No.: 11/519,154

(22) Filed: Sep. 12, 2006

(65) Prior Publication Data

US 2007/0007123 A1    Jan. 11, 2007

(30) Foreign Application Priority Data

Mar. 26, 2004    (JP) .................................. 2004-093472

(51) Int. Cl.
*C23C 14/00* (2006.01)
*C23C 14/32* (2006.01)
*C23C 16/00* (2006.01)
*C23C 16/50* (2006.01)

(52) U.S. Cl. ......... 204/192.23; 204/192.13; 204/192.15; 118/723 I; 118/723 R

(58) Field of Classification Search ............. 204/192.23, 204/192.13, 192.15; 118/723 I, 723 R
See application file for complete search history.

(56) References Cited

U.S. PATENT DOCUMENTS

| 5,952,061 | A | 9/1999 | Yoshida et al. |
| 2002/0066720 | A1 | 6/2002 | Ha et al. |
| 2007/0004111 | A1 | 1/2007 | Tomyo et al. |
| 2007/0007128 | A1 | 1/2007 | Tomyo et al. |
| 2007/0266947 | A1 | 11/2007 | Onoda et al. |

FOREIGN PATENT DOCUMENTS

EP    1 043 762 A1    10/2000
(Continued)

OTHER PUBLICATIONS

Japanese Machine Translation of JP No. 2000150500.*
(Continued)

*Primary Examiner* — Alexa D Neckel
*Assistant Examiner* — Michael Band
(74) *Attorney, Agent, or Firm* — Cheng Law Group, PLLC

(57) ABSTRACT

There are provided a method and an apparatus which form silicon dots having substantially uniform particle diameters and exhibiting a substantially uniform density distribution directly on a substrate at a low temperature. A hydrogen gas (or a hydrogen gas and a silane-containing gas) is supplied into a vacuum chamber (1) provided with a silicon sputter target (e.g., target 30), or the hydrogen gas and the silane-containing gas are supplied into the chamber (1) without arranging the silicon sputter target therein, a high-frequency power is applied to the gas(es) so that plasma is generated such that a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission is 10.0 or lower, and preferably 3.0 or lower, or 0.5 or lower, and silicon dots (SiD) having particle diameters of 20 nm or lower, or 10 nm or lower are formed directly on the substrate (S) at a low temperature of 500 deg. C. or lower in the plasma (and with chemical sputtering if a silicon sputter target is present).

18 Claims, 3 Drawing Sheets

FOREIGN PATENT DOCUMENTS

| | | |
|---|---|---|
| GB | 2 138 450 A | 10/1984 |
| JP | 60-241214 | 11/1985 |
| JP | 62-241214 | 10/1987 |
| JP | 62-243761 A | 10/1987 |
| JP | 06-100396 | 4/1994 |
| JP | 06-228746 | 8/1994 |
| JP | 09/237762 | 9/1997 |
| JP | 2000-150500 | 5/2000 |
| JP | 2000-150500 A | 5/2000 |
| JP | 2001-332497 | 11/2001 |
| JP | 2004-087888 | 3/2004 |
| JP | 2004-087888 A | 3/2004 |
| JP | 2004-179658 | 6/2004 |
| KR | 10-2005-0002987 A | 1/2005 |

OTHER PUBLICATIONS

Supplementary European Search Report for the Application No. EP 05 72 1589 dated Sep. 17, 2008.

Shirai, Hajime et al., "Formation of Nanocrystalline Silicon Dots from Chlorinated Materials by RF Plasma-Enhanced Chemical Vapor Deposition", Thin Solid Films, Elsevier, 2002, vol. 407, pp. 12-17.

Notification of Reasons for Refusal for the Application No. 2006-519454 from Japan Patent Office dated Oct. 7, 2008.

English Translation of International Preliminary Report dated Oct. 26, 2006.

Decision of Grant of Patent for the Application No. 10-2006-7019607 from Korean Patent Office dated Feb. 20, 2008.

* cited by examiner

SILICON DOT FORMING METHOD AND SILICON DOT FORMING APPARATUS

TECHNICAL FIELD

The present invention relates to a method and an apparatus for forming silicon dots (i.e., so-called silicon nanoparticles) of minute sizes that can be used as electronic device materials for single-electron devices and the like, and light emission materials and others.

BACKGROUND ART

As a method of forming silicon nanoparticles, such a physical manner has been known that silicon is heated and vaporized in an inert gas by excimer laser or the like, and also an in-gas vaporizing method is known (see Kanagawa-ken Sangyo Gijutu Sougou Kenkyusho Research Report No. 9/2003, pp 77-78). The latter method is configured to heat and vaporize the silicon by high-frequency induction heating or arc discharge instead of laser.

Such a CVD method is further known that a material gas is supplied into a CVD chamber, and silicon nanoparticles are formed on a heated substrate [see Japanese Laid-Open Patent Publication No. 2004-179658 (JP2004-179658A)].

In this method, nucleuses for growing silicon nanoparticles are formed on the substrate, and then the silicon nanoparticles are grown from the nucleuses.

However, the method of heating and vaporizing the silicon by laser irradiation cannot uniformly control an energy density for irradiating the silicon with the laser, and therefore it is difficult to uniformize the particle diameters and density distribution of silicon dots.

In the in-gas vaporizing method, the silicon is heated non-uniformly, and therefore the particle diameters and the density distribution of silicon dots cannot be uniformized without difficulty.

In the foregoing CVD method, the substrate must be heated to 550 deg. C. or higher for forming the nucleuses on the substrate, and the substrate of a low heat resistance cannot be employed, which narrows a selection range of the substrate material.

Accordingly, an object of the invention is to provide a method in which silicon dots having substantially uniform particle diameters and exhibiting a substantially uniform density distribution are formed directly on a silicon dot formation target substrate at a low temperature.

Also, it is an object of the invention to provide a silicon dot forming apparatus by which silicon dots having substantially uniform particle diameters and exhibiting a substantially uniform density distribution can be formed directly on a silicon dot formation target substrate at a low temperature.

DISCLOSURE OF THE INVENTION

The inventors made a research for achieving the above objects, and found the followings.

Plasma is formed from a sputtering gas (i.e., gas for sputtering such as a hydrogen gas), and chemical sputtering (reactive sputtering) is effected on a silicon sputter target with the plasma thus formed so that crystalline silicon dots having substantially uniform particle diameters and exhibiting a substantially uniform density distribution can be formed directly on the silicon dot formation target substrate at a low temperature.

In particular, such a plasma may be employed that a ratio (Si(288 nm)/Hβ) between an emission intensity Si(288 nm) of silicon atoms at a wavelength of 288 nm in plasma emission and an emission intensity Hβ of hydrogen atoms at a wavelength of 484 nm is 10.0 or lower, preferably 3.0 or lower, or 0.5 or lower, and chemical sputtering with this plasma can form the crystalline silicon dots having substantially uniform particle diameters in a range not exceeding 20 nm (and further 10 nm) and exhibiting a substantially uniform density distribution on the substrate even at a low temperature of 500 deg. C. or lower.

The plasma can be formed by supplying the sputtering gas (e.g., hydrogen gas) to a plasma formation region, and applying a high-frequency power thereto.

Further, the plasma may be formed by applying a high-frequency power to a gas prepared by diluting silane-containing gas with a hydrogen gas, and this plasma may be configured such that a ratio (Si(288 nm)/Hβ) between an emission intensity Si(288 nm) of silicon atoms at a wavelength of 288 nm in plasma emission and an emission intensity Hβ of hydrogen atoms at a wavelength of 484 nm is 10.0 or lower, preferably 3.0 or lower, or 0.5 or lower. With this plasma, it is possible to form the crystalline silicon dots having substantially uniform particle diameters in a range not exceeding 20 nm (and further 10 nm) and exhibiting a substantially uniform density distribution on a substrate even at a low temperature of 500 deg. C. or lower. In this case, the chemical sputtering of a silicon sputter target with the above plasma may be employed.

In any one of the above cases, the "substantially uniform particle diameters" of the silicon dots according to the invention represents the case where all the silicon dots have the equal or substantially equal particle diameters as well as the case where the silicon dots have particle diameters which are not uniform to a certain extent, but can be practically deemed as the substantially uniform particle diameters. For example, it may be deemed without any practical problem that the silicon dots have substantially uniform particle diameters when the particle diameters of the silicon dots fall or substantially fall within a predetermined range (e.g., not exceeding 20 nm, or not exceeding 10 nm). Also, even in the case where the particle diameters of the silicon dots are spread over a range from 5 nm to 6 nm and a range from 8 nm to 11 nm, it may be deemed without any practical problem that the particle diameters of the silicon dots substantially fall within a predetermined range (e.g., not exceeding 10 nm) as a whole. In these cases, the silicon dots have the "substantially uniform particle diameters" according to the invention. In summary, the "substantially uniform particle diameters" of the silicon dots represents the particle diameters which are substantially uniform as a whole from a practical viewpoint.

<Silicon Dot Forming Method>

Based on the above findings, the invention provides the following first, second, third and fourth silicon dot forming methods.

(1) First Silicon Dot Forming Method (First Method)

A silicon dot forming method comprising:

a silicon film forming step of supplying a silane-containing gas and a hydrogen gas into a vacuum chamber, applying a high-frequency power to these gases to generate plasma in the vacuum chamber, and forming a silicon film on an inner wall of the vacuum chamber with the plasma; and a silicon dot forming step of arranging a silicon dot formation target substrate in the vacuum chamber provided with the silicon film formed on the inner wall, supplying a sputtering gas into the vacuum chamber, applying a high-frequency power to the sputtering gas to generate the plasma in the vacuum chamber, and effecting chemical sputtering on a sputter target formed of the silicon film with the plasma to form silicon dots on the substrate.

(2) Second Silicon Dot Forming Method (Second Method)

A silicon dot forming method comprising:

a sputter target forming step of arranging a target substrate in a first vacuum chamber, supplying a silane-containing gas and a hydrogen gas into the first vacuum chamber, applying a high-frequency power to these gases to generate plasma in the first vacuum chamber, and forming a silicon film on the target substrate with the plasma to obtain a silicon sputter target; and a silicon dot forming step of transferring the silicon sputter target formed in the sputter target forming step from the first vacuum chamber into a second vacuum chamber without exposing the silicon sputter target to an ambient air, arranging a silicon dot formation target substrate in the second vacuum chamber, supplying a sputtering gas into the second vacuum chamber, applying a high-frequency power to the gas to generate the plasma in the second vacuum chamber, and effecting chemical sputtering on the silicon film of the silicon sputter target with the plasma to form silicon dots on the silicon dot formation target substrate.

According to the first method, since the silicon film serving as the sputter target is formed on the inner wall of the vacuum chamber, the target of a large area can be obtained as compared with the case where a commercially available silicon sputter target is independently arranged in the vacuum chamber, and therefore the silicon dots can be uniformly formed over a wide area on the substrate.

According to the first and second methods, silicon dots can be formed by employing the silicon sputter target that is not exposed to the ambient air, and thereby silicon dots can be formed while suppressing mixing of unintended impurities. Further, it is possible to form the crystalline silicon dots having substantially uniform particle diameters and exhibiting a substantially uniform density distribution directly on the silicon dot formation target substrate at a low temperature (e.g., with a low substrate temperature of 500 deg. C. or lower).

The silicon film sputtering gas may be typically formed of a hydrogen gas. For example, it may also be formed of a mixture of the hydrogen gas and a rare-gas (at least one kind of gas selected from a group including helium gas (He), neon gas (Ne), argon gas (Ar), krypton gas (Kr) and xenon gas (Xe)).

Thus, according to each of the first and second silicon dot forming methods, the silicon dot forming step can be executed in a manner such that a hydrogen gas is supplied as the sputtering gas into the vacuum chamber accommodating the silicon dot formation target substrate, and the high-frequency power is applied to the hydrogen gas to generate the plasma in the vacuum chamber. Thereby, the chemical sputtering is effected on the silicon film with the plasma to form the silicon dots of particle diameters not exceeding 20 nm or 10 nm directly on the substrate at a low temperature not exceeding 500 deg. C. (i.e., with a substrate temperature not exceeding 500 deg. C.).

In the first and second methods, the plasma is formed from the silane-containing gas and the hydrogen gas for forming the silicon film serving as the sputter target, and also the plasma is formed from the hydrogen gas for sputtering the silicon film. In each of these kinds of plasma formation, it is preferable that the plasma exhibits a ratio (Si(288 nm)/Hβ) of 10.0 or lower, and more preferably 3.0 or lower between an emission intensity Si(288 nm) of silicon atoms at a wavelength of 288 nm in the plasma emission and an emission intensity Hβ of hydrogen atoms at a wavelength of 484 nm.

The plasma may exhibit the ratio of 0.5 or lower. The reason for this will be described later in connection with the third and fourth methods.

(3) Third Silicon Dot Forming Method (Third Method)

A silicon dot forming method in which a hydrogen gas is supplied into a vacuum chamber accommodating a silicon sputter target and a silicon dot formation target substrate, and a high-frequency power is applied to the gas to generate, in the vacuum chamber, plasma exhibiting a ratio (Si(288 nm)/Hβ) of 10.0 or lower between an emission intensity Si(288 nm) of silicon atoms at a wavelength of 288 nm in the plasma emission and an emission intensity Hβ of hydrogen atoms at a wavelength of 484 nm in the plasma emission. Chemical sputtering is effected on the silicon sputter target with the plasma to form silicon dots of particle diameters not exceeding 20 nm directly on the substrate at a low temperature not exceeding 500 deg. C. (in other words, with a substrate temperature not exceeding 500 deg. C.).

(4) Fourth Silicon Dot Forming Method (Fourth Method)

A silicon dot forming method in which a silane-containing gas and a hydrogen gas are supplied into a vacuum chamber accommodating a silicon dot formation target substrate, a high-frequency power is applied to these gases to generate, in the vacuum chamber, plasma exhibiting a ratio (Si(288 nm)/Hβ) of 10.0 or lower between an emission intensity Si(288 nm) of silicon atoms at a wavelength of 288 nm and an emission intensity Hβ of hydrogen atoms at a wavelength of 484 nm in the plasma emission. Silicon dots of particle diameters not exceeding 20 nm are formed by the plasma directly on the substrate at a low temperature not exceeding 500 deg. C. (in other words, with a substrate temperature not exceeding 500 deg. C.).

In the fourth method, a silicon sputter target may be arranged in the vacuum chamber, and chemical sputtering of the target with the plasma may be additionally employed.

In any one of the foregoing first to fourth methods, when the emission intensity ratio (Si(288 nm)/Hβ) is 10.0 or lower in the plasma, this represents that the plasma is rich in hydrogen atom radicals.

In the first method, the plasma is formed from the silane-containing gas and the hydrogen gas for forming the silicon film serving as the sputter target on the inner wall of the vacuum chamber. In the second method, the plasma is formed from the silane-containing gas and the hydrogen gas for forming the silicon film on the sputter target substrate. In each of these kinds of plasma formation, when the plasma exhibits the emission intensity ratio (Si(288 nm)/Hp) of 10.0 or lower, and more preferably 3.0 or lower, or 0.5 or lower, a silicon film (silicon sputter target) of good quality suitable for forming the silicon dots on the silicon dot formation target substrate is smoothly formed on the inner wall of the vacuum chamber or the sputter target substrate at a low temperature of 500 deg. C. or lower.

In any one of the first, second and third methods, when the plasma used for sputtering the silicon sputter target exhibits the emission intensity ratio (Si(288 nm)/Hβ) of 10.0 or lower, and more preferably 3.0 or lower, or 0.5 or lower, it is possible to form the crystalline silicon dots having substantially uniform particle diameters in a range not exceeding 20 nm (and further 10 nm) and exhibiting a substantially uniform density distribution on the substrate at a low temperature of 500 deg. C. or lower.

In the fourth method, when the plasma produced from the silane-containing gas and the hydrogen gas likewise exhibits the emission intensity ratio (Si(288 nm)/Hβ) of 10.0 or lower, and more preferably 3.0 or lower, or 0.5 or lower, it is possible to form the crystalline silicon dots having substantially uniform particle diameters in a range not exceeding 20 nm (and further 10 nm) and exhibiting a substantially uniform density distribution on the substrate at a low temperature of 500 deg. C. or lower.

In any one of the methods, if the emission intensity ratio exceeds 10.0, it becomes difficult to grow crystal particles (dots), and a large amount of amorphous silicon is formed on the substrate. Therefore, the emission intensity ratio of 10.0 or lower is preferable. For forming the silicon dots of small particle diameters, the emission intensity ratio is preferably 3.0 or lower, and may be 0.5 or lower.

However, if the emission intensity ratio takes an excessively small value, the growth of the crystal particles (dots) becomes slow, and it takes a long time to attain the required dot particle diameter. If the ration takes a further small value, an etching effect exceeds the dot growth so that the crystal particles cannot grow. The emission intensity ratio (Si(288 nm)/Hβ) may be substantially 0.1 or more although the value may be affected by various conditions and the like.

The value of emission intensity ratio (Si(288 nm)/Hβ) can be obtained, for example, based on a measurement result obtained by measuring the emission spectrums of various radicals with an optical emission spectroscopic analyzer for plasma. The control of emission intensity ratio (Si(288 nm)/Hβ) can be performed by controlling the high-frequency power (e.g., frequency or magnitude of power) applied to the supplied gas(es), vacuum chamber gas pressure during silicon dot formation, and/or an amount of the gas (e.g., hydrogen gas, or hydrogen gas and silane-containing gas) supplied into the vacuum chamber.

According to the first and second silicon dot forming methods (and particularly in the case of using the hydrogen gas as the sputtering gas) as well as the third silicon dot forming method, the chemical sputtering is effected on the silicon sputter target with the plasma exhibiting the emission intensity ratio (Si(288 nm)/Hβ) of 10.0 or lower, preferably 3.0 or lower, or 0.5 or lower. This promotes formation of crystal nucleuses on the substrate, and the silicon dots grow from the nucleuses.

According to the fourth silicon dot forming method, the silane-containing gas and the hydrogen gas are excited and decomposed to promote the chemical reaction and therefore the formation of the crystal nucleuses on the substrate so that the silicon dots grow from the nucleuses. In the fourth method, the chemical sputtering of the silicon sputter target with the plasma may be additionally employed, which also promotes the formation of the crystal nucleuses on the substrate.

Since the crystal nucleus formation is promoted to grow the silicon dots, the nucleuses for growing the silicon dots can be formed relatively readily at a high density even when dangling bonds or steps that can form the nucleuses are not present on the silicon dot formation target substrate. In a portion where the hydrogen radicals and hydrogen ions are richer than the silicon radicals and silicon ions, and the nucleuses are contained at an excessively large density, desorption of silicon is promoted by a chemical reaction between the excited hydrogen atoms or hydrogen molecules and the silicon atoms, and thereby the nucleus density of the silicon dots on the substrate becomes high and uniform.

The silicon atoms and silicon radicals obtained by decomposition with the plasma and excited by the plasma are absorbed to the nucleuses and grow to the silicon dots by chemical reaction.

During this growth, the chemical reaction of absorption and desorption is promoted owing to the fact that the hydrogen radicals are rich, and the nucleuses grow to the silicon dots having substantially uniform crystal orientations and substantially uniform particle diameters. Owing to the above, the silicon dots having substantially uniform crystal orientations and particle sizes are formed on the substrate at a high density to exhibit a uniform distribution.

The invention is intended to form the silicon dots of minute particle diameters, e.g., of 20 nm or lower, and preferably 10 nm or lower on the silicon dot formation target substrate. In practice, it is difficult to form silicon dots having extremely small particle diameters, and therefore the particle diameters are about 1 nm or more although this value is not restrictive. For example, the diameters may be substantially in a range of 3 nm-15 nm, and more preferably in a range from 3 nm to 10 nm.

In the silicon dot forming method according to the invention, the silicon dots can be formed on the substrate at a low temperature of 500 deg. C. or lower (i.e., with the substrate temperature of 500 deg. C. or lower) and, in certain conditions, at a low temperature of 400 deg. C. or lower (i.e., with the substrate temperature of 400 deg. C. or lower). This increases a selection range of the substrate material. For example, the silicon dots can be formed on an inexpensive glass substrate having a low melting point and a heat-resistant temperature of 500 deg. C. or lower.

The invention is intended to form the silicon dots at a low temperature (typically, 500 deg. C. or lower). If the temperature of the silicon dot formation target substrate is low, crystallization of the silicon becomes difficult so that it is desired to form the silicon dots at a temperature of about 200 deg. C. or higher (i.e., with the substrate temperature of about 200 deg. C. or higher) although this depends on other various conditions.

In the fourth silicon dot forming method already described, both the silane-containing gas and the hydrogen gas are used as the plasma formation gases, in which case a gas supply flow rate ratio (silane-containing gas flow rate)/(hydrogen gas flow rate) into the vacuum chamber may be in a range from 1/200 to 1/30. If the ratio is smaller than 1/200, the crystal particles (dots) grow slowly, and a long time is required for achieving a required dot particle diameter. If the ratio is further smaller than the above, the crystal particles (dots) cannot grow. If the ratio is larger than 1/30, it becomes difficult to grow the crystal particles (dots), and a large amount of amorphous silicon is formed on the substrate.

When the supply flow rate of the silane-containing gas is, e.g., in a range from 1 sccm to 5 sccm, it is preferable that (silane-containing gas supply amount (sccm))/(vacuum chamber capacity (liter)) is in a range from 1/200 to 1/30. If this ratio is smaller than 1/200, the crystal particles (dots) grow slowly, and a long time is required for achieving a required dot particle diameter. If the ratio is further smaller than the above, the crystal particles (dots) cannot grow. If the ratio is larger than 1/30, it becomes difficult to grow the crystal particles (dots), and a large amount of amorphous silicon is formed on the substrate.

In any one of the first to fourth silicon dot forming method, the pressure in the vacuum chamber during the plasma formation may be in a range from about 0.1 Pa to about 10.0 Pa.

If the pressure is lower than 0.1 Pa, the crystal particles (dots) grow slowly, and a long time is required for achieving a required dot particle diameter. If the pressure is smaller than the above, the crystal particles (dots) cannot grow. If the pressure is higher than 10.0 Pa, it becomes difficult to grow the crystal particles (dots), and a large amount of amorphous silicon is formed on the substrate.

When the silicon sputter target is employed in the third silicon dot forming method as well as in the case of employing, in a combined manner, the chemical sputtering of the silicon sputter target in the fourth silicon dot forming method, the following configuration can be employed. A target substrate is arranged in a sputter target formation vacuum chamber, a silane-containing gas and a hydrogen gas are supplied into the vacuum chamber, a high-frequency power is applied to these gases to generate the plasma in the vacuum chamber, and the plasma forms a silicon film on the target substrate to provide the silicon sputter target. The silicon sputter target thus obtained can be transferred from the sputter target formation vacuum chamber into the vacuum chamber, in which the silicon dot formation target substrate is arranged, without exposing the silicon sputter target to an ambient air.

When the silicon sputter target is employed in the third silicon dot forming method as well as in the case of employing, in a combined manner, the chemical sputtering of the silicon sputter target in the fourth silicon dot forming method, the following configuration can be employed. The silicon sputter target may be primarily made of silicon, and may be made of single-crystalline silicon, polycrystalline silicon, microcrystalline silicon, amorphous silicon or a combination of two or more of them.

The silicon sputter target may be appropriately selected depending on uses of the silicon dots from a group including a target not containing impurities, a target containing a very small amount of impurities and a target containing an appropriate amount of impurities exhibiting a predetermined resistivity.

For example, the silicon sputter target not containing impurities and the silicon sputter target containing a very small amount of impurities may be a silicon sputter target in which an amount of each of phosphorus (P), boron (B) and germanium (Ge) is lower than 10 ppm.

The silicon sputter target exhibiting a predetermined resistivity may be a silicon sputter target exhibiting the resistivity from 0.001 ohm·cm to 50 ohm·cm.

In the second and third silicon dot forming methods as well as in the case of employing, in a combined manner, the chemical sputtering of the silicon sputter target in the fourth silicon dot forming method, the silicon sputter target is arranged or located in the vacuum chamber for the silicon dot formation. This arrangement of the target in the vacuum chamber is merely required to locate the target in the position allowing the chemical sputtering with the plasma, and the target may be arranged, e.g., along the whole or a part of the inner wall surface of the vacuum chamber. It may be independent in the chamber. The arrangement along the inner wall of the chamber and the independent arrangement may be employed in combination.

In the case where the silicon film is formed on the inner wall of the vacuum chamber to provide the silicon sputter target, or the silicon sputter target is arranged along the inner wall surface of the vacuum chamber, the vacuum chamber can be heated to heat the silicon sputter target, and the heated target can be sputtered more readily than the sputter target at a room chamber, and thus can readily form the silicon dots at a high density. For example, the vacuum chamber may be heated to 80 deg. C. or higher, e.g., by a band heater, heating jacket or the like. In view of economical reason or the like, the upper limit of the heating temperature is, e.g., about 300 deg. C. If O-rings or the like are used in the chamber, the temperature must be lower than 300 deg. C. in some cases depending on heat resistance thereof.

In any one of the silicon dot forming methods according to the invention, the high-frequency power is applied to the gas(es) supplied into the vacuum chamber by using an electrode which may be of either an inductive coupling type or a capacitive coupling type. When the employed electrode is of the inductive coupling type, it may be arranged in the vacuum chamber or outside the vacuum chamber.

The electrode arranged in the vacuum chamber may be coated with an electrically insulating film containing e.g., silicon or aluminum (e.g., silicon film, silicon nitride film, silicon oxide film or alumina film) for maintaining high-density plasma, suppressing mixing of impurities into the silicon dots due to sputtering of the electrode surface and the like.

When the electrode is of the capacitive coupling type, it is recommended to arrange the electrode perpendicularly to the substrate surface (more specifically, perpendicularly to a surface including the silicon dot formation target surface) so that it may not impede the silicon dot formation on the substrate.

In any one of the above cases, the frequency of the high-frequency power for the plasma formation may be in a range from about 13 MHz to about 100 MHz in view of inexpensive processing. If the frequency is higher than 100 MHz, the electric power cost becomes high, and matching becomes difficult when the high-frequency power is applied.

In any one of the above cases, a power density (applied power (W: watt))/(vacuum chamber capacity (L: liter)) is preferably in a range from about 5 W/L to about 100 W/L. If it is lower than 5 W/L, such a situation occurs to a higher extent that the silicon on the substrate becomes amorphous silicon, and does not form crystalline dots. If the density is larger than 100 W/L, a large damage is caused to the silicon dot formation target substrate surface (e.g., a silicon oxide film formed over the silicon wafer and defining the surface of the substrate). The upper limit may be about 50 W/L.

<Silicon Dot Structure>

The invention also includes a silicon dot structure including the silicon dots that are formed by any one of the silicon dot forming methods already described.

<Silicon Dot Forming Apparatus>

The invention provides first to fourth silicon dot forming apparatuses for implementing the silicon dot forming methods according to the invention.

(1) First Silicon Dot Forming Apparatus

A silicon dot forming apparatus including:

a vacuum chamber having a holder for holding a silicon dot formation target substrate;

a hydrogen gas supply device supplying a hydrogen gas into the vacuum chamber;

a silane-containing gas supply device supplying a silane-containing gas into the vacuum chamber;

an exhaust device exhausting a gas from the vacuum chamber;

a first high-frequency power applying device applying a high-frequency power to the hydrogen gas supplied into the vacuum chamber from the hydrogen gas supply device and the silane-containing gas supplied into the vacuum chamber from the silane-containing gas supply device, and thereby forming plasma for forming a silicon film on an inner wall of the vacuum chamber;

a second high-frequency power applying device applying a high-frequency power to the hydrogen gas supplied into the vacuum chamber from the hydrogen gas supply device after the above silicon film formation, and thereby forming plasma for effecting chemical sputtering on the silicon film used as a sputter target; and an optical emission spectroscopic analyzer for plasma obtaining a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission in the vacuum chamber.

This first silicon dot forming apparatus can implement the first silicon dot forming method.

The first silicon dot forming apparatus may further include a control portion comparing the emission intensity ratio (Si(288 nm)/Hβ) obtained by the optical emission spectroscopic analyzer for plasma with a reference emission intensity ratio (Si(288 nm)/Hβ) predetermined within a range not exceeding 10.0 in the process of forming the plasma by at least the second high-frequency power applying device in a group including the first and second high-frequency power applying device, and controlling at least one of a power output of the second high-frequency power applying device, a supply amount of the hydrogen gas supplied from the hydrogen gas supply device into the vacuum chamber and an exhaust amount of the exhaust device such that the emission intensity ratio (Si(288 nm)/Hβ) of the plasma in the vacuum chamber changes toward the reference emission intensity ratio.

In any one of the above cases, the first and second high-frequency power applying devices may partially or entirely share the same structure.

The reference emission intensity ratio may be determined in a range not exceeding 3.0 or 0.5.

(2) Second Silicon Dot Forming Apparatus

A silicon dot forming apparatus including:

a first vacuum chamber having a holder for holding a sputter target substrate;

a first hydrogen gas supply device supplying a hydrogen gas into the first vacuum chamber;

a silane-containing gas supply device supplying a silane-containing gas into the first vacuum chamber;

a first exhaust device exhausting a gas from the first vacuum chamber;

a first high-frequency power applying device applying a high-frequency power to the hydrogen gas supplied into the first vacuum chamber from the first hydrogen gas supply device and the silane-containing gas supplied into the first vacuum chamber from the silane-containing gas supply device, and thereby forming plasma for forming a silicon film on the sputter target substrate;

a second vacuum chamber airtightly communicated with the first vacuum chamber and having a holder for holding a silicon dot formation target substrate;

a transferring device transferring the silicon sputter target substrate provided with the silicon film from the first vacuum chamber into the second vacuum chamber without exposing the sputter target substrate to an ambient air;

a second hydrogen gas supply device supplying a hydrogen gas into the second vacuum chamber;

a second exhaust device exhausting a gas from the second vacuum chamber;

a second high-frequency power applying device applying a high-frequency power to the hydrogen gas supplied from the second hydrogen gas supply device into the second vacuum chamber, and thereby forming plasma for effecting chemical sputtering on the silicon film on the sputter target substrate;

an optical emission spectroscopic analyzer for plasma obtaining a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission in the second vacuum chamber.

This second silicon dot forming apparatus can implement the second silicon dot forming method.

The second silicon dot forming apparatus may further include a control portion comparing the emission intensity ratio (Si(288 nm)/Hβ) obtained by the optical emission spectroscopic analyzer for plasma with a reference emission intensity ratio (Si(288 nm)/Hβ) predetermined within a range not exceeding 10.0 in the process of forming the plasma by the second high-frequency power applying device, and controlling at least one of a power output of the second high-frequency power applying device, a supply amount of the hydrogen gas supplied from the second hydrogen gas supply device into the second vacuum chamber and an exhaust amount of the second exhaust device such that the emission intensity ratio (Si(288 nm)/Hβ) of the plasma in the second vacuum chamber changes toward the reference emission intensity ratio.

In any one of the above cases, the apparatus may include, for the first vacuum chamber, an optical emission spectroscopic analyzer for plasma obtaining a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission in the first vacuum chamber. In this case, a control portion similar to the above may be employed for this analyzer.

The first and second high-frequency power applying devices may partially or entirely share the same structure.

The first and second hydrogen gas supply devices may partially or entirely share the same structure.

The first and second exhaust devices may partially or entirely share the same structure.

The transferring device may be arranged, e.g., in the first or second vacuum chamber. The first and second vacuum chambers may be directly connected together via a gate valve or the like, or may be indirectly connected together via a vacuum chamber which is arranged between them and is provided with the foregoing transferring device.

In any one of the above cases, the reference emission intensity ratio may be determined in a range not exceeding 3.0 or 0.5.

The apparatus may be provided with a second silane-containing gas supply device supplying a silane-containing gas into the second vacuum chamber, whereby the apparatus can implement the method of additionally employing the chemical sputtering of the silicon sputter target in the foregoing fourth silicon dot forming method.

(3) Third Silicon Dot Forming Apparatus

A silicon dot forming apparatus including a vacuum chamber having a holder for holding a silicon dot formation target substrate; a silicon sputter target arranged in the vacuum chamber; a hydrogen gas supply device supplying a hydrogen gas into the vacuum chamber; an exhaust device exhausting a gas from the vacuum chamber; a high-frequency power applying device applying a high-frequency power to the hydrogen gas supplied into the vacuum chamber from the hydrogen gas supply device and thereby forming plasma for effecting chemical sputtering on the silicon sputter target; and an optical emission spectroscopic analyzer for plasma obtaining a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission in the vacuum chamber.

This third silicon dot forming apparatus can implement the third silicon dot forming method.

The third silicon dot forming apparatus may further include a control portion comparing the emission intensity ratio (Si(288 nm)/Hβ) obtained by the optical emission spectroscopic analyzer for plasma with a reference emission intensity ratio (Si(288 nm)/Hβ) predetermined within a range not exceeding 10.0, and controlling at least one of a power output of the high-frequency power applying device, a supply amount of the hydrogen gas supplied from the hydrogen gas supply device into the vacuum chamber and an exhaust amount of the exhaust device such that the emission intensity ratio (Si(288 nm)/Hβ) of the plasma in the vacuum chamber changes toward the reference emission intensity ratio.

The reference emission intensity ratio may be determined in a range not exceeding 3.0 or 0.5.

(4) Fourth Silicon Dot Forming Apparatus

A silicon dot forming apparatus including a vacuum chamber having a holder for holding a silicon dot formation target substrate; a hydrogen gas supply device supplying a hydrogen gas into the vacuum chamber; a silane-containing gas supply device supplying a silane-containing gas into the vacuum chamber; an exhaust device exhausting a gas from the vacuum chamber; a high-frequency power applying device applying a high-frequency power to the gases supplied into the vacuum chamber from the hydrogen gas supply device and the silane-containing gas supply device, and thereby forming plasma for silicon dot formation; and an optical emission spectroscopic analyzer for plasma obtaining a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission in the vacuum chamber.

This fourth silicon dot forming apparatus can implement the fourth silicon dot forming method.

The fourth silicon dot forming apparatus may further include a control portion comparing the emission intensity ratio (Si(288 nm)/Hβ) obtained by the optical emission spectroscopic analyzer for plasma with a reference emission intensity ratio (Si(288 nm)/Hβ) predetermined within a range not exceeding 10.0, and controlling at least one of a power output of the high-frequency power applying device, a supply amount of the hydrogen gas supplied from the hydrogen gas supply device into the vacuum chamber, a supply amount of the silane-containing gas supplied from the silane-containing gas supply device into the vacuum chamber and an exhaust amount of the exhaust device such that the emission intensity ratio (Si(288 nm)/Hβ) of the plasma in the vacuum chamber changes toward the reference emission intensity ratio.

The reference emission intensity ratio may be determined in a range not exceeding 3.0 or 0.5.

The silicon sputter target may be arranged in the vacuum chamber.

In any one of the first to fourth silicon dot forming apparatuses described above, the apparatus may include, as an example of the optical emission spectroscopic analyzer for plasma, a first detecting portion detecting the emission intensity Si(288 nm) of silicon atoms at a wavelength of 288 nm in plasma emission, a second detecting portion detecting the emission intensity Hβ of hydrogen atoms at a wavelength of 484 nm in the plasma emission, and an arithmetic portion obtaining the ratio (Si(288 nm)/Hβ) between the emission intensity Si(288 nm) detected by the first detecting portion and the emission intensity Hβ detected by the second detecting portion.

According to the invention as described above, the silicon dots having substantially uniform particle diameters can be formed directly on the silicon dot formation target substrate at a low temperature with a uniform density distribution.

Also, the invention can provide the silicon dot forming apparatus that can form the silicon dots having substantially uniform particle diameters directly on the silicon dot formation target substrate at a low temperature with a uniform density distribution.

BRIEF DESCRIPTION OF THE DRAWINGS

FIG. 3 is a block diagram illustrating an example of a circuit performing control of an exhaust amount (vacuum chamber pressure) by an exhaust device and the like.

FIG. 5 illustrates a positional relationship between a target substrate for forming a silicon film, electrodes and the like.

PREFERRED EMBODIMENTS FOR IMPLEMENTING THE INVENTION

Embodiments of the invention will now be described with reference to the drawings.

<Example of Silicon Dot Forming Apparatus>

Figure 1:
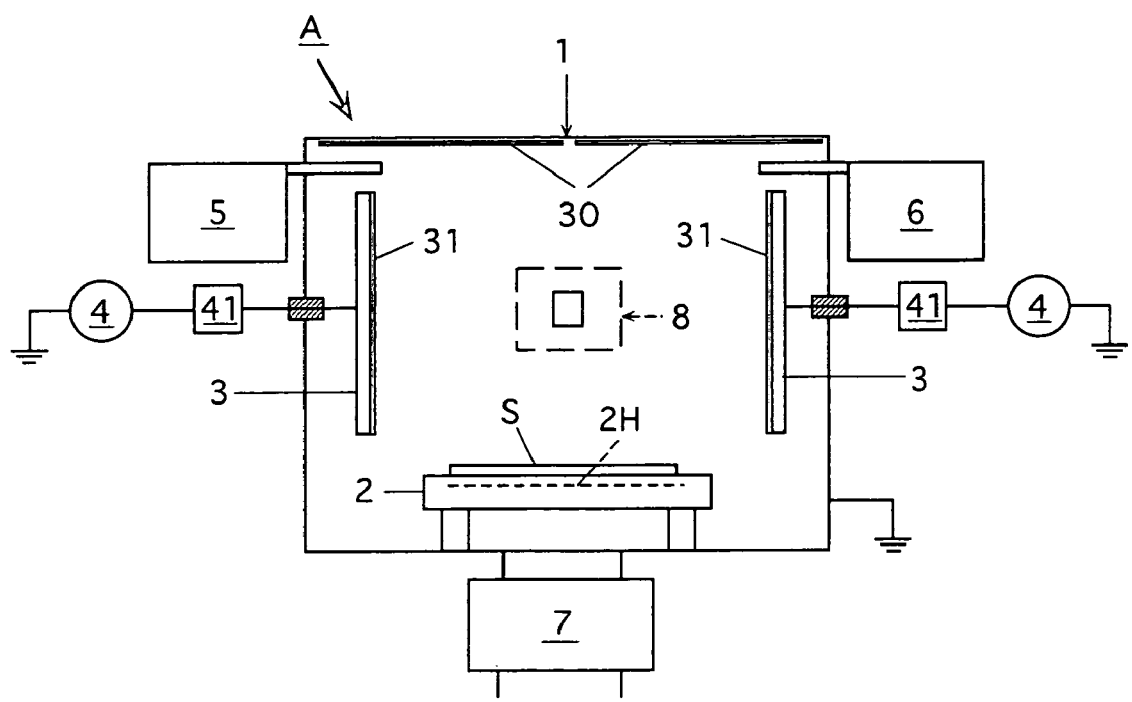
FIG. 1 shows a schematic structure of an example of an apparatus used for implementing a silicon dot forming method according to the invention.

FIG. 1 shows a schematic structure of an example of an silicon dot forming apparatus used for implementing a silicon dot forming method according to the invention.

An apparatus A shown in FIG. 1 is employed for forming silicon dots on a plate-like silicon dot formation target substrate or base body (i.e., substrate S in this example), and includes a vacuum chamber 1, a substrate holder 2 arranged in the chamber 1, a pair of discharge electrodes 3 laterally spaced from each other in a region above the substrate holder 2 in the chamber 1, high-frequency power sources 4 for discharge each connected to the discharge electrode 3 via a matching box 41, a gas supply device 5 for supplying a hydrogen gas into the chamber 1, a gas supply device 6 for supplying a silane-containing gas containing a silicon (i.e., having silicon atoms) into the chamber 1, an exhaust device 7 connected to the chamber 1 for exhausting a gas from the chamber 1, an optical emission spectroscopic analyzer for plasma 8 for measuring a state of plasma produced in the chamber 1 and the like. The power sources 4, matching boxes 41 and electrodes 3 form a high-frequency power applying device.

The silane-containing gas may be monosilane ($SiH_4$), and also may be disilane ($Si_2H_6$), silicon fluoride ($SiF_4$), silicon tetrachloride ($SiCl_4$), dichlorosilane ($SiH_2Cl_2$) or the like.

The substrate holder 2 is provided with a substrate heating heater 2H.

The electrode 3 is provided at its inner side surface with a silicon film 31 functioning as an insulating film. Silicon sputter targets 30 are arranged in advance on inner surfaces of a top wall and the like of the chamber 1.

Each electrode 3 is arranged perpendicularly to a surface of the silicon dot formation target substrate S (which will be described later) on the substrate holder 2 (more specifically, perpendicularly to a surface including the surface of the substrate S).

The silicon sputter target 30 can be selected from among commercially available silicon sputter targets (1)-(3) described below depending on the use or the like of the silicon dots to be formed.

(1) A target made of single-crystalline silicon, a target made of polycrystalline silicon, a target made of microcrystalline silicon, a target made of amorphous silicon or a target made of a combination of two or more of them.

(2) A silicon sputter target which is made of one of the materials in the above item (1), and in which a content of each of phosphorus (P), boron (B) and germanium (Ge) is lower than 10 ppm.

(3) A silicon sputter target made of one of the materials in the above item (1), and exhibiting a predetermined resistivity (e.g., a silicon sputter target exhibiting the resistivity from 0.001 ohm·cm to 50 ohm·cm).

The power source 4 is of an output-variable type, and can supply a high-frequency power at a frequency of 60 MHz. The frequency is not restricted to 60 MHz, may be selected from a range, e.g., from about 13.56 MHz to about 100 MHz, or from a higher range.

The chamber 1 and the substrate holder 2 are grounded.

The gas supply device 5 includes the hydrogen gas source as well as a valve, a massflow controller for flow control and the like which are not shown in the figure.

The gas supply device 6 can supply a silane-containing gas such as monosilane ($SiH_4$), and includes a gas source of the monosilane as well as a valve, a massflow controller for flow control and the like which are not shown in the figure.

The exhaust device 7 includes an exhaust pump as well as a conductance valve for controlling an exhaust flow rate and the like which are not shown in the figure.

The optical emission spectroscopic analyzer 8 for plasma can detect the emission spectrums of products of gas decomposition, and the emission intensity ratio (Si(288 nm)/Hβ) can be obtained based on a result of the detection.

Figure 2:
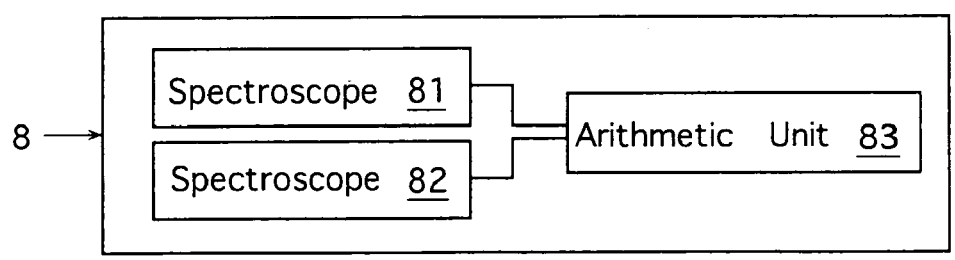
FIG. 2 is a block diagram illustrating an optical emission spectroscopic analyzer for plasma.
Figure 3:
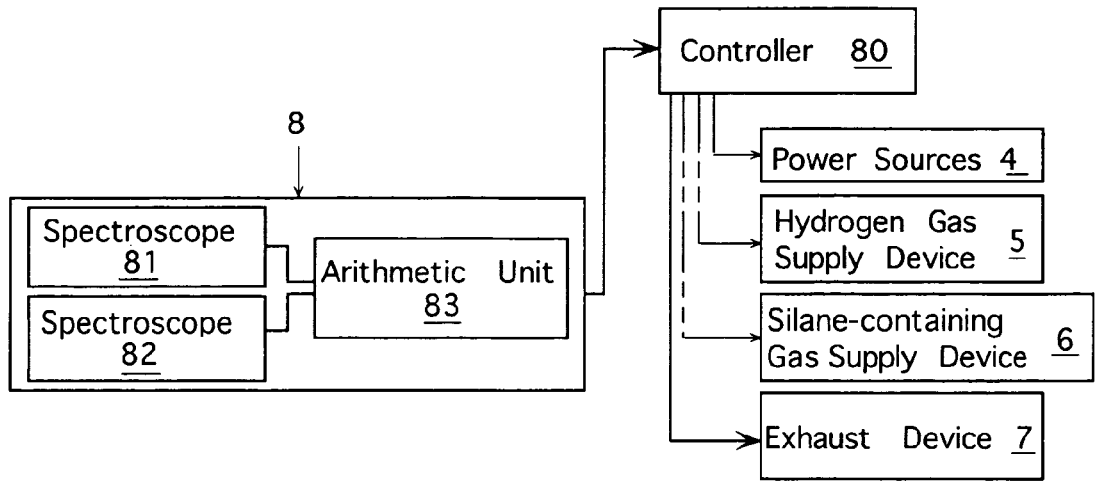

A specific example of the optical emission spectroscopic analyzer 8 for plasma may include, as shown in FIG. 2, a spectroscope 81 detecting the emission intensity Si(288 nm) of silicon atoms at a wavelength of 288 nm in plasma emission in the vacuum chamber 1, a spectroscope 82 detecting the emission intensity Hβ of hydrogen atoms at a wavelength of 484 nm in the plasma emission, and an arithmetic unit 83 obtaining the ratio (Si(288 nm)/Hβ) between the emission intensity Si(288 nm) and the emission intensity Hβ detected by the spectroscopes 81 and 82. Instead of the spectroscopes 81 and 82, photosensors each provided with a filter may be employed.

<Silicon Dot Formation by Apparatus A with Hydrogen Gas>

Description will now be given on an example of formation of the silicon dots on the substrate or base body (substrate in this example) S by the silicon dot forming apparatus A described above, and particularly on the case where only the hydrogen gas is used as the plasma formation gas.

When forming the silicon dots, the pressure in the vacuum chamber 1 is kept in a range from 0.1 Pa to 10.0 Pa. The vacuum chamber pressure can be sensed, e.g., by a pressure sensor (not shown) connected to the chamber.

First, prior to the silicon dot formation, the exhaust device 7 starts exhausting from the chamber 1. A conductance valve (not shown) of the exhaust device 7 is already adjusted in view of the above pressure from 0.1 Pa to 10.0 Pa for the silicon dot formation in the chamber 1.

When the exhaust device 7 lowers the pressure in the chamber 1 to a predetermined value or lower, the gas supply device 5 starts supplying of the hydrogen gas into the chamber 1, and the power sources 4 apply the power to the electrodes 3 to produce plasma from the supplied hydrogen gas.

From the gas plasma thus produced, the optical emission spectroscopic analyzer 8 for plasma calculates the emission intensity ratio (Si(288 nm)/Hβ), and determines the magnitude of the high-frequency power (e.g., in a range from 1000 watts to 8000 watts in view of cost), the amount of supplied hydrogen gas, the pressure in the chamber 1 and the like such that the above calculated ratio may change toward a range from 0.1 to 10.0, and more preferably to a range from 0.1 to 3.0, or from 0.1 to 0.5.

The magnitude of the high-frequency power is determined such that the power density (applied power (W: watt))/ (vacuum chamber capacity (L: liter)) of the high-frequency power applied to the electrodes 3 preferably falls within a range from 5 W/L to 100 W/L, or in a range from 5 W/L to 50 W/L.

After determining the silicon dot formation conditions as described above, the silicon dots are formed according to the conditions.

When forming the silicon dots, the silicon dot formation target substrate or base body (substrate in this example) S is arranged on the substrate holder 2 in the chamber 1, and is heated by the heater 2H to a temperature (e.g., of 400 deg. C.) not exceeding 500 deg. C. The exhaust device 7 operates to maintain the pressure for the silicon dot formation in the chamber 1, and the gas supply device 5 supplies the hydrogen gas into the chamber 1 so that the power sources 4 apply the high-frequency power to the discharge electrodes 3 to produce the plasma from the supplied hydrogen gas.

In this manner, the ratio (Si(288 nm)/Hβ) between the emission intensity Si(288 nm) of silicon atoms at the wavelength of 288 nm and the emission intensity Hβ of hydrogen atoms at the wavelength of 484 nm in plasma emission falls within the range from 0.1 to 10.0, and more preferably within the range from 0.1 to 3.0, or from 0.1 to 0.5, and thus the plasma having the foregoing reference emission intensity ratio or substantially having the foregoing reference emission intensity ratio is generated. Chemical sputtering (reactive sputtering) is effected with the above plasma on the silicon sputter targets 30 on the inner wall of the top wall and the like of the chamber 1 so that silicon dots having the particle diameters of 20 nm or lower and exhibiting the crystallinity are formed on the surface of the substrate S.

<Silicon Dot Formation by Apparatus A with Hydrogen Gas and Silane-Containing Gas>

When forming the silicon dots as described above, the silane-containing gas that can be supplied from the gas supply device 6 is not used, and only the hydrogen gas is used. However, the silicon dots can be formed by supplying the silane-containing gas from the gas supply device 6 while supplying the hydrogen gas from the gas supply device 5 into the vacuum chamber 1. When using both the silane-containing gas and the hydrogen gas, the silicon dots can be formed without employing the silicon sputter targets 30.

When employing the silane-containing gas together with the silicon sputter target(s) 30 or without using the target(s) 30, the plasma can be generated such that the ratio (Si(288 nm)/Hβ) between the emission intensity Si(288 nm) of silicon atoms at the wavelength of 288 nm and the emission intensity Hβ of hydrogen atoms at the wavelength of 484 nm in plasma emission falls within the range from 0.1 to 10.0, and more preferably within the range from 0.1 to 3.0, or from 0.1 to 0.5. Even when the silicon sputter target 30 is not employed, the silicon dots having the particle diameters of 20 nm or lower and exhibiting the crystallinity are formed on the surface of the substrate S.

When employing the silicon sputter target 30, the chemical sputtering effected on the silicon sputter target 30 on the inner surface of the top wall and the like with the plasma can be additionally employed so that the silicon dots having the particle diameters of 20 nm or lower and exhibiting the crystallinity are formed on the surface of the substrate S.

In any one of the above cases, the pressure in the vacuum chamber 1 is maintained in a range from 0.1 Pa to 10.0 Pa, and the magnitude of the high-frequency power, amounts of supplied hydrogen gas and silane-containing gas, pressure in the chamber 1 and the like are determined for the silicon dot formation such that the emission intensity ratio (Si(288 nm)/Hβ) calculated by the optical emission spectroscopic analyzer 8 for plasma may attain the value (the reference emission intensity ratio) falling within a range from 0.1 to 10.0, and more preferably a range from 0.1 to 3.0 or from 0.1 to 0.5, or may substantially attain the reference emission intensity ratio.

The magnitude of the high-frequency power is determined such that the power density (applied power (W: watt))/ (vacuum chamber capacity (L: liter)) of the high-frequency power applied to the electrodes 3 falls within a range from 5 W/L to 100 W/L, or in a range from 5 W/L to 50 W/L, and the silicon dot formation may be performed under the silicon dot formation conditions thus determined.

The supply flow rate ratio (silane-containing gas flow rate)/ (hydrogen gas flow rate) between the silane-containing gas and the hydrogen gas supplied into the vacuum chamber 1 is determined in a range from 1/200 to 1/30. The supply flow rate of the silane-containing gas is, e.g., in a range from 1 sccm to 5 sccm, and the ratio of (silane-containing gas supply flow rate (sccm))/(vacuum chamber capacity (liter)) may be in a range from 1/200 to 1/30. When the supply flow rate of the silane-containing gas is substantially in a range from 1 sccm to 5 sccm, the appropriate supply flow rate of the hydrogen gas is, e.g., in a range from 150 sccm to 200 sccm.

In the silicon dot forming apparatus A described above, each of the electrodes is an electrode of a capacitive coupling type having a flat form, but may be an electrode of an inductive coupling type. The electrode of the inductive coupling type may have various forms such as a rod-like form or a coil-like form. The number of the electrode of the inductive coupling type is not restricted. In the case of employing an electrode of the inductive coupling type as well as the silicon sputter target, the silicon sputter target may be arranged along the whole of or a part of the inner surface of the chamber wall, may be independently arranged in the chamber or may be arranged in both the manners in spite of whether the electrode is arranged inside the chamber or outside the chamber.

In connection with the apparatus A, the chamber 1 may be heated by means (e.g., band heater, heating jacket internally passing heat medium) for heating the vacuum chamber 1 (although not shown in the figure) to heat the silicon sputter target to 80 deg. C. or higher for promoting sputtering of the silicon sputter target.

<Another Example of Control of Vacuum Chamber Inner Pressure or the Like>

When forming the silicon dots as described above, manual operations are performed with reference to the emission intensity ratio obtained by the optical emission spectroscopic analyzer for plasma 8 for controlling the output of the output-variable power sources 4, the hydrogen gas supply amount of the hydrogen gas supply device 5 (or the hydrogen gas supply amount of the hydrogen gas supply device 5 and the silane-containing gas supply amount of the silane-containing gas supply device 6), the exhaust amount of the exhaust device 7 and others.

However, the emission intensity ratio (Si(288 nm)/Hβ) obtained by the arithmetic unit 83 of the optical emission spectroscopic analyzer 8 for plasma may be applied to a controller 80. The controller 80 may be configured as follows. The controller 80 determines whether the emission intensity ratio (Si(288 nm)/Hβ) applied from the arithmetic unit 83 is the predetermined reference emission intensity ratio or not. When it is different from the reference emission intensity ratio, the controller 80 can control at least one of the output of the output-variable power sources 4, the supply amount of the hydrogen gas supplied from the hydrogen gas supply device 5, the supply amount of the silane-containing gas supplied from the silane-containing gas supply device 6 and the exhaust amount of the exhaust device 7.

As a specific example, the controller 80 may be configured such that the controller 80 controls the exhaust amount of the exhaust device 7 by controlling the conductance valve thereof, and thereby controls the gas pressure in the vacuum chamber 1 to attain the foregoing reference emission intensity ratio.

In this case, the output of the output-variable power sources 4, the hydrogen gas supply amount of the hydrogen gas supply device 5 (or the hydrogen gas supply amount of the hydrogen gas supply device 5 and the silane-containing gas supply amount of the silane-containing gas supply device 6) and the exhaust amount of the exhaust device 7 are controlled based on the initial values of the power output, the hydrogen gas supply amount (or supply amounts of the hydrogen gas and the silane-containing gas) and the exhaust amount which can achieve the reference emission intensity ratio or a value close to it, and are determined in advance by experiments or the like.

When determining the above initial values, the exhaust amount of the exhaust device 7 is determined such that the pressure in the vacuum chamber 1 falls within the range from 0.1 Pa to 10.0 Pa.

The output of the power source 4 is determined such that the power density of the high-frequency power applied to the electrode 3 may fall within the range from 5 W/L to 100 W/L, or from 5 W/L to 50 W/L.

When both the hydrogen gas and silane-containing gas are used as the gases for plasma formation, the gas supply flow rate ratio (silane-containing gas flow rate)/(hydrogen gas flow rate) into the vacuum chamber 1 is determined in a range from 1/200 to 1/30. For example, the supply flow rate of the silane-containing gas 1 sccm-5 sccm, and (silane-containing gas supply flow rate (sccm))/(vacuum chamber capacity (liter)) is determined in a range from 1/200 to 1/30.

The output of the power source 4 and the hydrogen gas supply amount of the hydrogen gas supply device 5 (or the hydrogen gas supply amount of the hydrogen gas supply device 5 and the silane-containing gas supply amount of the silane-containing gas supply device 6) will be maintained at the initial values thus determined, and the exhaust amount of the exhaust device 7 is controlled by the controller 80 to attain the reference emission intensity ratio.

<Another Example of Silicon Sputter Target>

In the method of forming the silicon dots as described above, the silicon sputter target is formed of a commercially available target, and is arranged in the vacuum chamber 1 in an independent step. However, by employing the silicon sputter target that has not been exposed to an ambient air, it is possible to form the silicon dots that are further protected from unintended mixing of impurities.

More specifically, in the apparatus A described above, the hydrogen gas and silane-containing gas are supplied into the vacuum chamber 1 when the substrate S is not yet arranged therein, and the power sources 4 apply the high-frequency power to these gases to form the plasma, which forms a silicon film on the inner wall of the vacuum chamber 1. When forming the silicon film, it is preferable to heat the chamber wall by an external heater. Thereafter, the substrate S is arranged in the chamber 1, and the chemical sputtering is effected on the sputter target formed of the silicon film with the plasma produced from the hydrogen gas so that the silicon dots are formed on the substrate S as described above.

In the process of forming the silicon film to be used as the silicon sputter target, it is desired for forming the silicon film of good quality that the emission intensity ratio (Si(288 nm)/

Hβ) in the plasma falls within the range from 0.1 to 10.0, and more preferably within the range from 0.1 to 3.0, or from 0.1 to 0.5.

Another method may be employed as described below.

Figure 4:
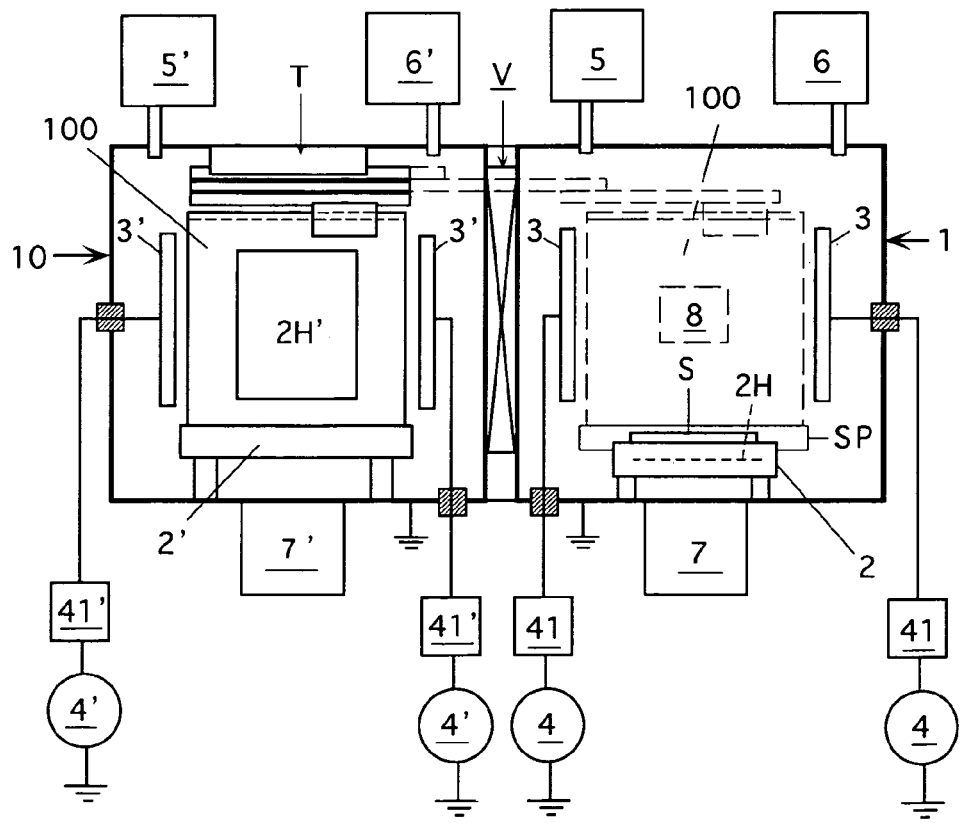
FIG. 4 shows another example of silicon dot formation.

As schematically shown in FIG. 4, a vacuum chamber 10 for forming a silicon sputter target is communicated with the vacuum chamber 1 via a gate valve V in an airtight fashion with respect to an ambient air.

A target substrate 100 is arranged on a holder 2' in the chamber 10, and an exhaust device 7' exhausts a gas from the vacuum chamber 10 to keep a predetermined deposition pressure. A hydrogen gas supply device 5' and a silane-containing gas supply device 6' supply the hydrogen gas and the silane-containing gas into the chamber while keeping the predetermined deposition pressure, respectively. Further, an output-variable power sources 4' apply the high-frequency power to electrodes 3' in the chamber through matching boxes 41' to form the plasma. By this plasma, the silicon film is formed on the target substrate 100 heated by a heater 2H'.

Thereafter, the gate valve V is opened, and a transfer device T transfers the target substrate 100 bearing the silicon film into the vacuum chamber 1, and sets it on a base SP in the chamber 1. Then, the transfer device T returns, and the gate valve V is airtightly closed and one of the silicon dot forming methods already described is executed to form the silicon dots on the substrate S arranged in the chamber 1, using the target substrate 100 bearing the silicon film as the silicon sputter target in the chamber 1.

Figure 5:
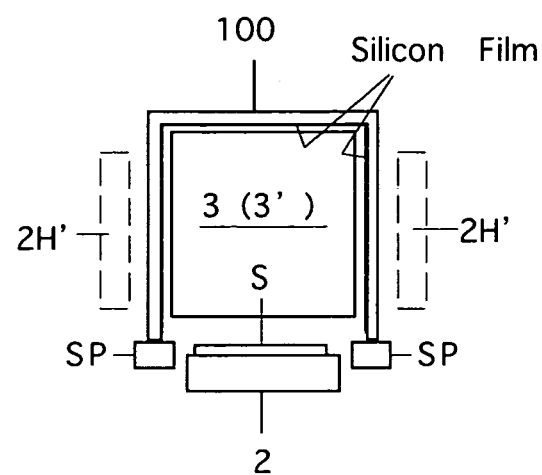

FIG. 5 shows positional relationships of the target substrate 100 with respect to the electrodes 3 (or 3'), the heater 2H' in the chamber 10, the base SP in the chamber 1, the substrate S and the like. The target substrate 100 has a substantially inverted U-shaped section for obtaining the silicon sputter target of a large area as shown in FIG. 5, although it may have another form. The transfer device T can transfer the substrate 100 without colliding the substrate 100 against the electrodes or the like. The transfer device T may have various structures provided that it can bring the substrate 100 into the vacuum chamber 1 and can set it therein. For example, the transfer device T may have a structure having an extensible arm for holding the substrate 100.

When forming the silicon film on the target substrate in the chamber 10, it is desired that the emission intensity ratio (Si(288 nm)/Hβ) of the plasma falls within the range from 0.1 to 10.0, and more preferably within the range from 0.1 to 3.0, or from 0.1 to 0.5.

In this case, the output of the power sources 4' in the vacuum chamber 10, the hydrogen gas supply amount of the hydrogen gas supply device 5', the silane-containing gas supply amount of the silane-containing gas supply device 6' and the exhaust amount of the exhaust device 7' are controlled similarly to the case of forming the silicon dots on the substrate S with the hydrogen gas and the silane-containing gas. Manual control may be performed, and automatic control with the controller may also be performed.

In connection with the transfer device, a vacuum chamber provided with a transfer device may be arranged between the vacuum chambers 10 and 1, and the chamber provided with the transfer device may be connected to each of the chambers 10 and 1 via a gate valve.

EXPERIMENTAL EXAMPLE (1) Experimental Example 1

A silicon dot forming apparatus of the type shown in FIG. 1 was used. However, the silicon sputter target was not employed, and the silicon dots were directly formed on the substrate with the hydrogen gas and the monosilane gas. Dot formation conditions were as follows:

Substrate: silicon wafer coated with oxide film ($SiO_2$)
Chamber capacity: 180 liters
High-frequency power source: 60 MHz, 6 kW
Power density: 33 W/L
Substrate temperature: 400 deg. C. (400° C.)
Inner pressure of chamber: 0.6 Pa
Hydrogen supply amount: 150 sccm
Silane supply amount: 3 sccm
Si(288 nm)/Hβ: 0.5

Figure 6:
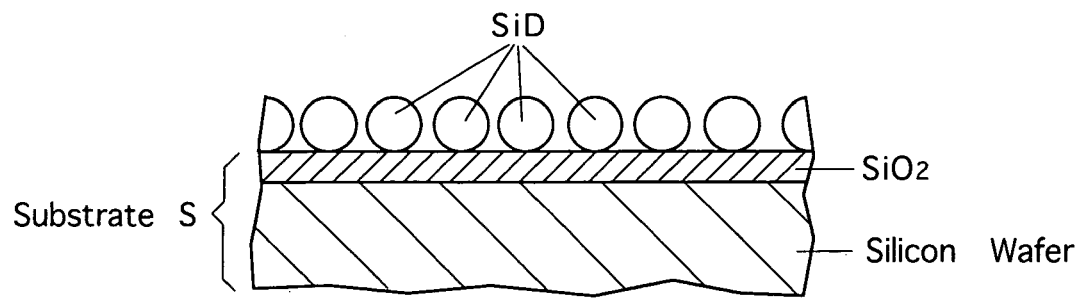
FIG. 6 schematically shows an example of a silicon dot structure obtained by an experimental example.

After forming the dots, the section of the substrate was observed with a transmission electron microscope (TEM), and it was confirmed that the silicon dots having substantially the uniform particle diameters were formed independently from each other, and these silicon dots exhibited a uniform distribution and a high density state. From the TEM images, the particle diameters of the silicon dots of 50 in number were measured. The average of the measured values was 7 nm, and it was confirmed that the silicon dots of the particle diameters not exceeding 20 nm and particularly not exceeding 10 nm were formed. The dot density was about $1.4 \times 10^{12}$ pcs(particles)/$cm^2$. FIG. 6 schematically illustrates an example of the silicon dot structure provided with silicon dots SiD on the substrate S.

(2) Experimental Example 2

The silicon dot forming apparatus of the type shown in FIG. 1 was used. The hydrogen gas and the monosilane gas were used, and further the silicon sputter target was used. The silicon dots were directly formed on the substrate. Dot formation conditions were as follows:

Silicon sputter target: amorphous silicon sputter target
Substrate: silicon wafer coated with oxide film ($SiO_2$)
Chamber capacity: 180 liters
High-frequency power source: 60 MHz, 4 kW
Power density: 22 W/L
Substrate temperature: 400 deg. C.
Inner pressure of chamber: 0.6 Pa
Silane supply amount: 1 sccm
Hydrogen supply amount: 150 sccm
Si(288 nm)/Hβ: 0.3

After forming the dots, the section of the substrate was observed with the transmission electron microscope (TEM), and it was confirmed that the silicon dots having substantially the uniform particle diameters were formed independently from each other, and these silicon dots exhibited a uniform distribution and a high density state. From the TEM images, the particle diameters of the silicon dots of 50 in number were measured. The average of the measured values was 10 nm, and it was confirmed that the silicon dots of the particle diameters not exceeding 20 nm were formed. The dot density was about $1.0 \times 10^{12}$ pcs/$cm^2$.

(3) Experimental Example 3

The silicon dot forming apparatus of the type shown in FIG. 1 was used. However, the silane gas was not used, and the hydrogen gas and the silicon sputter target were used. The silicon dots were directly formed on the substrate. Dot formation conditions were as follows:

Silicon sputter target: monocrystalline silicon sputter target
Substrate: silicon wafer coated with oxide film ($SiO_2$)
Chamber capacity: 180 liters High-frequency power source: 60 MHz, 4 kW
Power density: 22 W/L
Substrate temperature: 400 deg. C.
Inner pressure of chamber: 0.6 Pa
Hydrogen supply amount: 100 sccm
Si(288 nm)/Hβ: 0.2

After forming the dots, the section of the substrate was observed with the transmission electron microscope (TEM), and it was confirmed that the silicon dots having substantially the uniform particle diameters were formed independently from each other, and these silicon dots exhibited a uniform distribution and a high density state. From the TEM images, the particle diameters of the silicon dots of 50 in number were measured. The average of the measured values was 5 nm, and it was confirmed that the silicon dots of the particle diameters not exceeding 20 nm and particularly not exceeding 10 nm were formed. The dot density was about $2.0 \times 10^{12}$ pcs/cm$^2$.

(4) Experimental Example 4

The silicon dot forming apparatus of the type shown in FIG. 1 was used. First, a silicon film was formed on the inner wall of the vacuum chamber 1, and then the silicon dots were formed using the silicon film as the sputter target. Silicon film formation conditions and dot formation-conditions were as follows:
Silicon Film Formation Conditions
    Chamber inner wall area: about 3 m$^2$
    Chamber capacity: 440 liters
    High-frequency power source: 13.56 MHz, 10 kW
    Power density: 23 W/L
    Inner wall temperature of chamber: 80 deg. C. (heated by heater in chamber)
    Inner pressure of chamber: 0.67 Pa
    Monosilane supply amount 100 sccm
    Hydrogen supply amount: 150 sccm
    Si(288 nm)/Hβ: 2.0
Dot Formation Conditions
    Substrate: silicon wafer coated with oxide film (SiO$_2$)
    Chamber capacity: 440 liters
    High-frequency power source: 13.56 MHz, 5 kW
    Power density: 11 W/L
    Inner wall temperature of chamber: 80 deg. C. (heated by heater in chamber)
    Substrate temperature: 430 deg. C.
    Inner pressure of chamber: 0.67 Pa
    Hydrogen supply amount: 150 sccm (monosilane gas was not used)
    Si(288 nm)/Hβ: 1.5

After forming the dots, the section of the substrate was observed with the transmission electron microscope (TEM), and it was confirmed that the silicon dots having substantially the uniform particle diameters were formed independently from each other, and these silicon dots exhibited a uniform distribution and a high density state. Small dots have diameters from 5 nm to 6 nm, and large dots have diameters of 9 nm-11 nm. From the TEM images, the particle diameters of the silicon dots of 50 in number were measured. The average of the measured values was 8 nm, and it was confirmed that the silicon dots of the particle diameters not exceeding 10 nm were formed. The dot density was about $7.3 \times 10^{11}$ pcs/cm$^2$.

(5) Experimental Example 5

The silicon dot forming apparatus of the type shown in FIG. 1 was used. First, a silicon film was formed on the inner wall of the vacuum chamber 1 under the same silicon film formation conditions as those in the experimental example 4, and then the silicon dots were formed using the silicon film as the sputter target. The dot formation conditions were the same as those of the experimental example 4 except for that the inner pressure of the chamber was 1.34 Pa, and Si(288 nm)/Hβ was 2.5.

After forming the dots, the section of the substrate was observed with the transmission electron microscope (TEM), and it was confirmed that the silicon dots having substantially the uniform particle diameters were formed independently from each other, and these silicon dots exhibited a uniform distribution and a high density state. From the TEM images, the particle diameters of the silicon dots of 50 in number were measured. The average of the measured values was 10 nm, and it was confirmed that the silicon dots of the particle diameters not exceeding 10 were formed. The dot density was about $7.0 \times 10^{11}$ pcs/cm$^2$.

(6) Experimental Example 6

The silicon dot forming apparatus of the type shown in FIG. 1 was used. First, a silicon film was formed on the inner wall of the vacuum chamber 1 under the same silicon film formation conditions as those in the experimental example 4, and then the silicon dots were formed using the silicon film as the sputter target. The dot formation conditions were the same as those of the experimental example 4 except for that the inner pressure of the chamber was 2.68 Pa, and Si(288 nm)/Hβ was 4.6.

After forming the dots, the section of the substrate was observed with the transmission electron microscope (TEM), and it was confirmed that the silicon dots having substantially the uniform particle diameters were formed independently from each other, and these silicon dots exhibited a uniform distribution and a high density state. From the TEM images, the particle diameters of the silicon dots of 50 in number were measured. The average of the measured values was 13 nm, and it was confirmed that the silicon dots of the particle diameters not exceeding 20 nm were formed. The dot density was about $6.5 \times 10^{11}$ pcs/cm$^2$.

(7) Experimental Example 7

The silicon dot forming apparatus of the type shown in FIG. 1 was used. First, a silicon film was formed on the inner wall of the vacuum chamber 1 under the same silicon film formation conditions as those in the experimental example 4, and then the silicon dots were formed using the silicon film as the sputter target. The dot formation conditions were the same as those of the experimental example 4 except for that the inner pressure of the chamber was 6.70 Pa, and Si(288 nm)/Hp was 8.2.

After forming the dots, the section of the substrate was observed with the transmission electron microscope (TEM), and it was confirmed that the silicon dots having substantially the uniform particle diameters were formed independently from each other, and these silicon dots exhibited a uniform distribution and a high density state. From the TEM images, the particle diameters of the silicon dots of 50 in number were measured. The average of the measured values was 16 nm, and it was confirmed that the silicon dots of the particle diameters not exceeding 20 nm were formed. The dot density was about $6.1 \times 10^{11}$ pcs/cm$^2$.

Industrial Applicability

The invention can be used for forming the silicon dots of minute particle diameters that are used as electron device materials for single-electron devices and the like, light emission materials and others.

What is claimed is:

1. A silicon dot forming method including:

a silicon film forming step of supplying a silane-containing gas and a hydrogen gas into a vacuum chamber, applying a high-frequency power to these gases to generate plasma in the vacuum chamber, and forming a silicon film on an inner wall of the vacuum chamber with the plasma; and a silicon dot forming step of arranging a silicon dot formation target substrate in said vacuum chamber provided with the silicon film formed on the inner wall, supplying a sputtering gas into the vacuum chamber, applying a high-frequency power to the gas to generate the plasma in the vacuum chamber, and effecting chemical sputtering on a sputter target formed of the silicon film with the plasma to form silicon dots on the substrate;

wherein the plasma exhibits a ratio (Si(288 nm)/Hβ) of 10.0 or lower between an emission intensity Si(288 nm) of silicon atoms at a wavelength of 288 nm and an emission intensity Hβ of hydrogen atoms at a wavelength of 484 nm in plasma emission; and wherein the ratio (Si(288 nm)/Hβ) of 10.0 or lower is obtained by comparing a measured emission intensity ratio (Si(288 nm)/Hβ) with a reference emission intensity ratio (Si(288 nm)/Hβ) predetermined within a range not exceeding 10.0, and controlling at least one of a power output of a high-frequency power applying device, a supply amount of the hydrogen gas supplied from a hydrogen gas supply device into the vacuum chamber, a supply amount of the silane-containing gas supplied from a silane-containing gas supply device into the vacuum chamber, and an exhaust amount of an exhaust device such that the emission intensity ratio (Si(288 nm)/Hβ) of the plasma in the vacuum chamber changes toward the reference emission intensity ratio.

2. A silicon dot forming method comprising:

a sputter target forming step of arranging a target substrate in a first vacuum chamber, supplying a silane-containing gas and a hydrogen gas into the first vacuum chamber, applying a high-frequency power to these gases to generate plasma in the first vacuum chamber, and forming a silicon film on the target substrate with the plasma to obtain a silicon sputter target; and a silicon dot forming step of transferring the silicon sputter target formed in said sputter target forming step from said first vacuum chamber into a second vacuum chamber without exposing the silicon sputter target to an ambient air, arranging a silicon dot formation target substrate in the second vacuum chamber, supplying a sputtering gas into the second vacuum chamber, applying a high-frequency power to the gas to generate the plasma in the second vacuum chamber, and effecting chemical sputtering on said silicon film of the silicon sputter target with the plasma to form silicon dots on the silicon dot formation target substrate;

wherein the plasma exhibits a ratio (Si(288 nm)/Hβ) of 10.0 or lower between an emission intensity Si(288 nm) of silicon atoms at a wavelength of 288 nm and an emission intensity Hβ of hydrogen atoms at a wavelength of 484 nm in plasma emission; and wherein the ratio (Si(288 nm)/Hβ) of 10.0 or lower is obtained by comparing a measured emission intensity ratio (Si(288 nm)/Hβ) with a reference emission intensity ratio (Si(288 nm)/Hβ) predetermined within a range not exceeding 10.0, and controlling at least one of a power output of a high-frequency power applying device, a supply amount of the hydrogen gas supplied from a hydrogen gas supply device into the vacuum chamber, a supply amount of the silane-containing gas supplied from a silane-containing gas supply device into the vacuum chamber, and an exhaust amount of an exhaust device such that the emission intensity ratio (Si(288 nm)/Hβ) of the plasma in the vacuum chamber changes toward the reference emission intensity ratio.

3. The silicon dot forming method according to claim 1 or 2, wherein said silicon dot forming step is executed such that a hydrogen gas is supplied as said sputtering gas into the vacuum chamber accommodating said silicon dot formation target substrate, the high-frequency power is applied to the hydrogen gas to generate the plasma in the vacuum chamber, and the chemical sputtering is effected on said silicon film with the plasma to form the silicon dots of particle diameters not exceeding 20 nm directly on said substrate at a low temperature not exceeding 500 deg. C.

4. The silicon dot forming method according to claim 3, wherein said silicon dot forming step is executed such that the silicon dots of particle diameters not exceeding 10 nm are formed directly on said substrate.

5. The silicon dot forming method according to claim 1 or 2, wherein said emission intensity ratio (Si(288 nm)/Hβ) is 3.0 or lower.

6. A silicon dot forming method, wherein a silane-containing gas and a hydrogen gas are supplied into a vacuum chamber accommodating a silicon dot formation target substrate, a high-frequency power is applied to these gases to generate, in the vacuum chamber, plasma exhibiting a ratio (Si(288 nm)/Hβ) of 10.0 or lower between an emission intensity Si(288 nm) of silicon atoms at a wavelength of 288 nm and an emission intensity Hβ of hydrogen atoms at a wavelength of 484 nm in plasma emission, and silicon dots of particle diameters not exceeding 20 nm are formed by the plasma directly on said substrate at a low temperature not exceeding 500 deg. C.;

wherein the ratio (Si(288 nm)/Hβ) of 10.0 or lower is obtained by comparing a measured emission intensity ratio (Si(288 nm)/Hβ) with a reference emission intensity ratio (Si(288 nm)/Hβ) predetermined within a range not exceeding 10.0, and controlling at least one of a power output of a high-frequency power applying device, a supply amount of the hydrogen gas supplied from a hydrogen gas supply device into the vacuum chamber, a supply amount of the silane-containine gas supplied from a silane-containing gas supply device into the vacuum chamber, and an exhaust amount of an exhaust device such that the emission intensity ratio (Si(288 nm)/Hβ) of the plasma in the vacuum chamber changes toward the reference emission intensity ratio.

7. The silicon dot forming method according to claim 6, wherein said emission intensity ratio (Si(288nm)/Hβ) is 3.0 or lower.

8. The silicon dot forming method according to claim 6 or 7, wherein the silicon dots of particle diameters not exceeding 10 nm arc formed directly on said substrate.

9. The silicon dot forming method according to claim 6 or 7, wherein a silicon sputter target is arranged in said vacuum chamber, and chemical sputtering of the sputter target with said plasma is additionally employed.

10. The silicon dot forming method according to any one of the preceding claim 6 or 7, wherein a supply flow rate ratio (silane-containing gas flow rate)/(hydrogen gas flow rate) of said silane-containing gas and said hydrogen gas supplied into said vacuum chamber is in a range from 1/200 to 1/30.

11. The silicon dot forming method according to any one of the preceding claim 6 or 7, wherein the supply amount of said silane-containing gas is in a range from 1 sccm to 5 sccm, and (silane-containing gas supply amount (sccm))/(vacuum chamber capacity (liter)) is in a range from 1/200 to 1/30.

12. The silicon dot forming method according to any one of the preceding claims 1, 2, 6 or 7, wherein the application of the high-frequency power to the gas(es) supplied into said vacuum chamber is performed by an electrode arranged in said vacuum chamber and coated with an electrically insulating film containing silicon or aluminum.

13. The silicon dot forming method according to any one of the preceding claim 1, 2, 6 or 7, wherein the pressure in said vacuum chamber is in a range from 0.1 Pa to 10.0 Pa when forming said plasma.

14. The silicon dot forming method according to any one of the preceding claim 1, 2, 6 or 7, wherein the application of the high-frequency power to the gas(es) supplied into said vacuum chamber is performed by an electrode of a capacitive coupling type arranged in said vacuum chamber and being perpendicular to said silicon dot formation target substrate.

15. The silicon dot forming method according to any one of the preceding claims 1, 2, 6 or 7, wherein the application of the high-frequency power to the gas(es) supplied into said vacuum chamber is performed by an electrode of an inductive coupling type.

16. The silicon dot forming method according to any one of the preceding claim 1, 2, 6 or 7, wherein said high-frequency power has a frequency in a range from 13 MHz to 100 MHz.

17. The silicon dot forming method according to any one of the preceding claims 1, 2, 6 or 7, wherein a power density (applied power (W: watt))/(vacuum chamber capacity (L: liter)) is in a ranged from 5 W/L to 100 W/L.

18. A silicon dot structure having a silicon dot formed by the silicon dot forming method according to any one of the preceding claim 1, 2, 6 or 7.

* * * * *